United States Patent
Chen

(10) Patent No.: US 7,796,431 B2
(45) Date of Patent: Sep. 14, 2010

(54) PAGE BUFFER USED IN A NAND FLASH MEMORY AND PROGRAMMING METHOD THEREOF

(75) Inventor: Chih Hao Chen, Taipei County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 204 days.

(21) Appl. No.: 12/243,183

(22) Filed: Oct. 1, 2008

(65) Prior Publication Data

US 2010/0080059 A1 Apr. 1, 2010

(51) Int. Cl.
G11C 11/34 (2006.01)
G11C 16/04 (2006.01)

(52) U.S. Cl. .............................. 365/185.12; 365/185.17

(58) Field of Classification Search ............ 365/185.12, 365/185.17, 185.22, 185.03
See application file for complete search history.

(56) References Cited

U.S. PATENT DOCUMENTS

| | | | |
|---|---|---|---|
| 7,009,878 B2 | 3/2006 | Hosono et al. | |
| 7,254,064 B2 | 8/2007 | Kim et al. | |
| 7,515,484 B2 * | 4/2009 | Seong | 365/189.05 |
| 7,706,190 B2 * | 4/2010 | Yang et al. | 365/185.22 |
| 2007/0002615 A1 * | 1/2007 | Lee et al. | 365/185.03 |
| 2008/0008008 A1 | 1/2008 | Chen et al. | |

* cited by examiner

Primary Examiner—Anh Phung
(74) Attorney, Agent, or Firm—WPAT, P.C.; Anthony King

(57) ABSTRACT

A page buffer used in a NAND flash memory comprises a first latch circuit, a second latch circuit, a bit line voltage supply circuit and a verification circuit comprising a first verification path, a second verification path and a third verification path. The first latch circuit and the second latch circuit latch the data programmed into and read from the NAND flash memory. The bit line voltage supply circuit supplies bit line voltages to the corresponding bit line of the NAND flash memory. The verification circuit verifies the programming operations of the NAND flash memory. The first verification path is for the verification of a first LSB programming operation. The second verification path is for the verification of a second LSB programming operation before the first LSB programming operation is verified. The third verification path is for the verification of the second LSB programming operation after the first LSB programming operation is verified.

21 Claims, 7 Drawing Sheets

PAGE BUFFER USED IN A NAND FLASH MEMORY AND PROGRAMMING METHOD THEREOF

BACKGROUND OF THE INVENTION

1. Field of the Invention

The present invention relates to a page buffer used in a NAND flash memory and the programming method thereof, and more particularly, to a page buffer used in a NAND flash memory and the programming method thereof providing cache function.

2. Description of the Related Art

Flash memory devices are generally classified into NOR flash memories and NAND flash memories. In NOR flash memories, the memory cells are connected in parallel to bit lines, resembling the parallel connection of transistors in CMOS NOR gates, and thus are known as NOR flash memory. The memory cells in NOR flash memories can be randomly accessed. Thus NOR flash memories are mainly used in BIOS of personal computers, or in firmware of ASIC. The memory cells in NAND flash memories, on the other hand, are connected in series resulting a smaller cell size than that of the NOR flash memories. Thus, NAND flash can provide a smaller die size and faster write and read time than NOR flash. However, the memory cells in NAND flash memories cannot be randomly accessed. Therefore, NAND flash memories are mainly used in storage devices, such as hard disks or memory cards.

Each memory cell in a NAND flash memory resembles a standard MOSFET, except that there is a floating gate below the control gate of each memory cell, wherein the floating gate is isolated by an oxide layer. Electrons placed on the floating gate will be trapped for years, modifying the threshold voltage of the cell. A traditional single layer cell (SLC) of a NAND flash memory may have a normal threshold voltage or a modified threshold voltage, and therefore provides two states, i.e., one bit, for the NAND flash memory. Recently, to increase the integration of memory cells of NAND flash memories, multi level cells (MLC), which provide more than one bit for the NAND flash memory, and therefore exhibit multiple threshold voltages, are widely utilized in NAND flash memories.

A conventional NAND flash memory comprises a memory cell array, a row decoder connected to the word lines of the memory cell array, and a page buffer connected to the bit lines of the memory cell array. FIG. 1 shows two string memory cells of a memory cell array of a conventional NAND flash memory. The memory cell array 20 comprises a plurality of memory cells 10 connected in series between a bit line (BL1 or BL2) and a ground select line GSL. A group of memory cells 10 connected in series to one bit line (BL1 or BL2) along with select transistors (a string select transistor SST and a ground select transistor GST) used to select the memory cells 10 is called a string. The string select transistor SST is selectively switched on to couple the associated string and the bit line together. The ground select transistor GST is selectively switched to control the connection between each string and a common source line CSL. Bit lines BL1 or BL2 are connected to a page buffer 30. Word lines WL1 to WL16, SSL and GSL are connected to a row decoder 40. The row decoder 40 determines which memory cells are programmed or read. The page buffer 30 performs the programming and reading operations of the selected memory cells.

U.S. Pat. No. 7,254,064 discloses a page buffer design comprising three latch circuits. Each memory cell comprises two bits: MSB and LSB. The programming operations include two MSB programming and one LSB programming. Two of the latch circuits are used in the MSB programming operation, and the remaining one is used for the cache function.

U.S. Pat. No. 7,009,878 discloses a page buffer design comprising two latch circuits. Each memory cell comprises two bits: MSB and LSB. The programming operations include two MSB programming and one LSB programming. The cache function is achievable in the LSB programming. The cache function is prohibited, however, in the MSB programming.

US patent 2008/0,008,008, herein incorporated by reference and hereinafter '008, discloses a page buffer design comprising two latch circuits. Each memory cell comprises two bits: MSB and LSB. The programming operations include one MSB programming and two LSB programming. The cache function is not implemented in this disclosure.

The cache function for the programming operation is not available in the aforesaid prior page buffer design utilizing two latch circuits, while the three latch circuit design requires too much die size. Therefore, there is a need to design a page buffer with cache function for the programming operation requiring only two latch circuits.

SUMMARY OF THE INVENTION

The first embodiment of the present invention is a page buffer used in a NAND flash memory comprising a first latch circuit, a second latch circuit, a bit line voltage supply circuit and a verification circuit comprising a first verification path, a second verification path and a third verification path. The first latch circuit latches the LSB of programmed data during a first and a second LSB programming operation. The second latch circuit latches the MSB of the programmed data during the first and the second LSB programming operation. The bit line voltage supply circuit supplies bit line voltages to the corresponding bit line of the NAND flash memory. The verification circuit verifies the programming operations of the NAND flash memory. The first verification path is for the verification of the first LSB programming operation. The second verification path is for the verification of the second LSB programming operation before the first LSB programming operation is verified. The third verification path is for the verification of the second LSB programming operation after the first LSB programming operation is verified.

The second embodiment of the present invention is a method for programming the LSB of a NAND flash memory cell connected to a page buffer, wherein the memory cell comprises two bits, and the page buffer comprises a first latch circuit and a second latch circuit. The method comprises the steps of: latching the input data into the second latch circuit; transferring the data latched in the second latch circuit to the first latch circuit; latching the MSB of the memory cell into the second latch circuit; programming the input data to the memory cell; and verifying the programming operation while latching the next input data into the second latch circuit.

BRIEF DESCRIPTION OF THE DRAWINGS

The invention will be described according to the appended drawings in which.

DETAILED DESCRIPTION OF THE INVENTION

Figure 1:
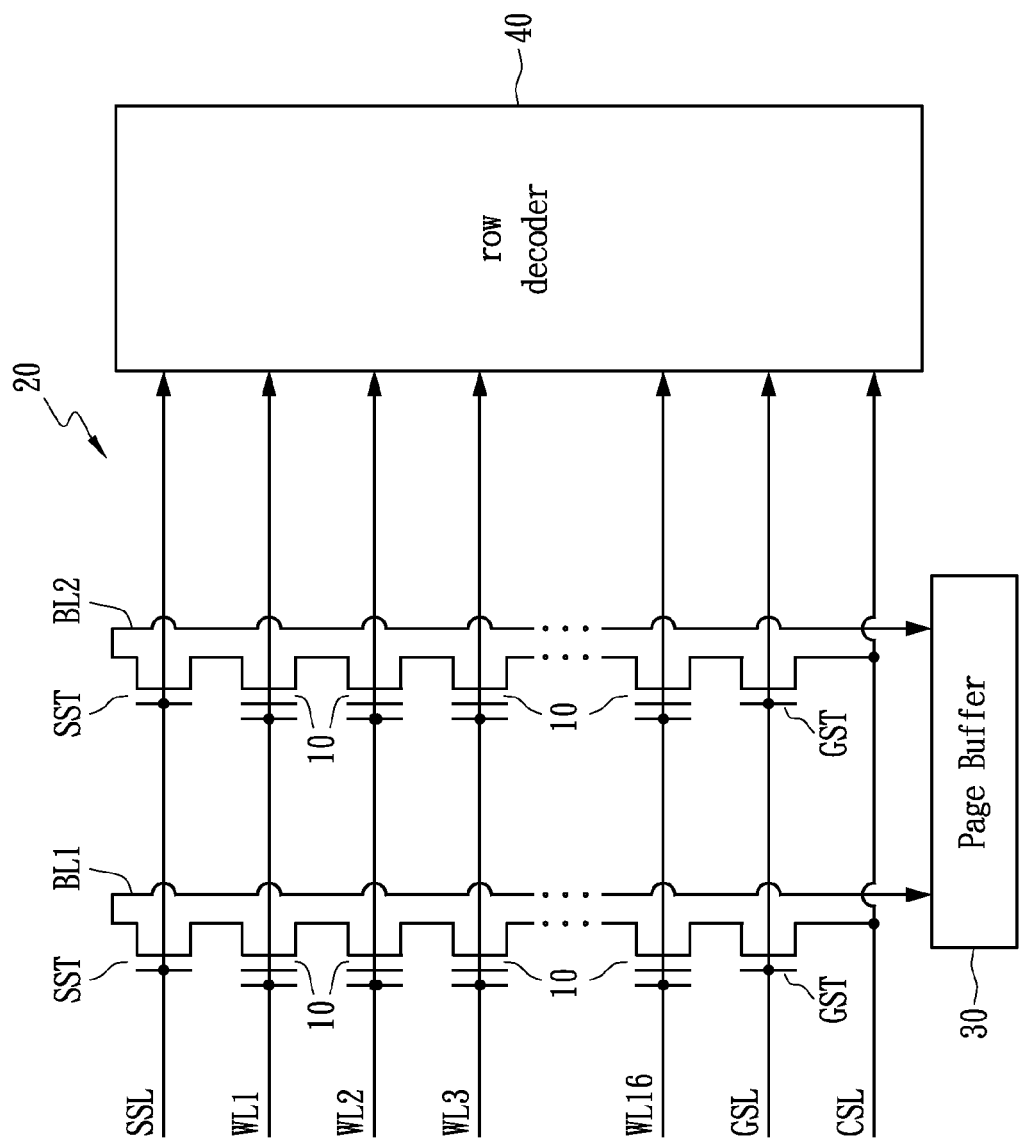
FIG. 1 shows two string memory cells of a memory cell array of a conventional NAND flash memory.
Figure 2:
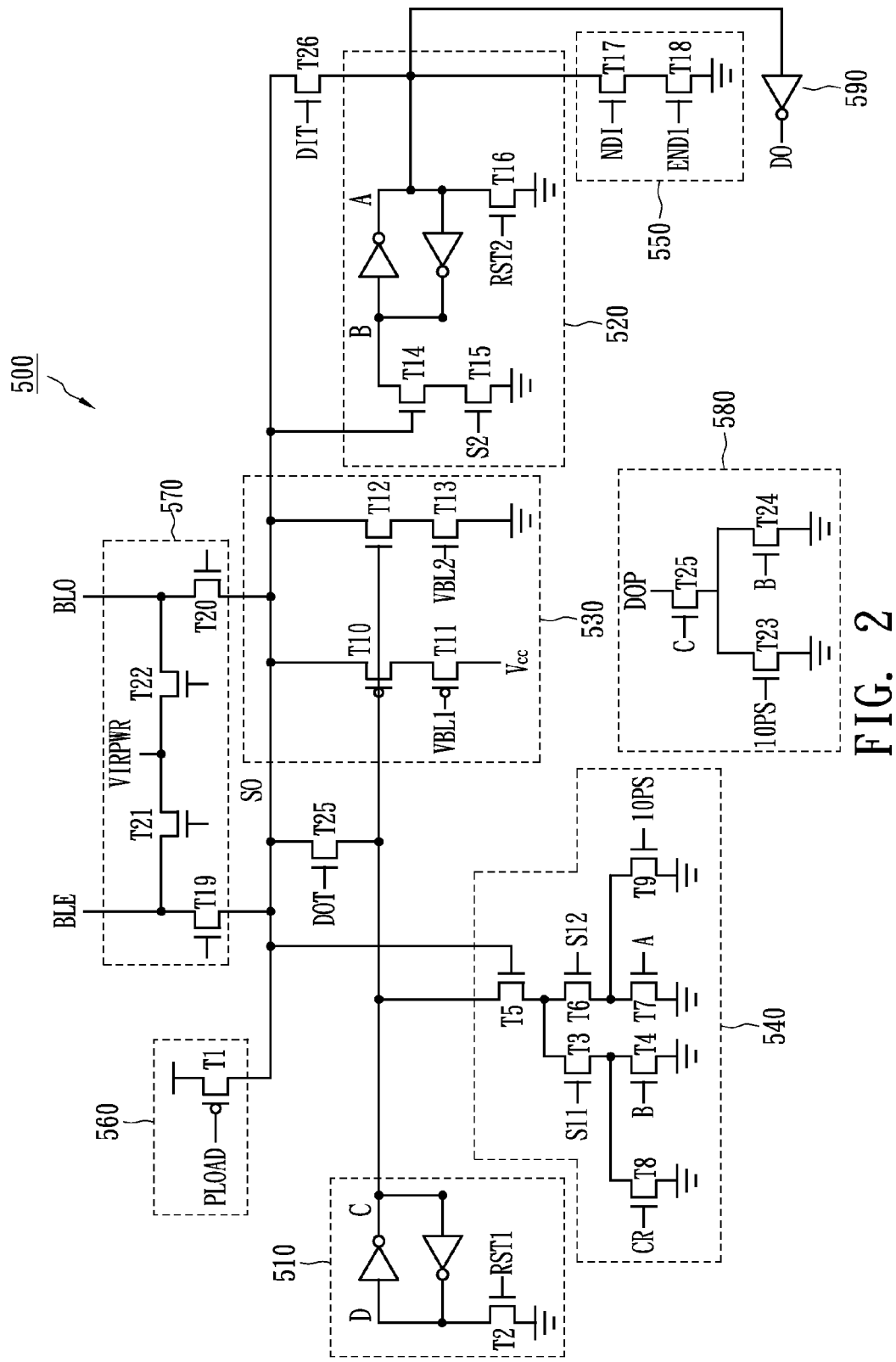
FIG. 2 shows the first embodiment of a page buffer used in a NAND flash memory of the present invention.

FIG. 2 shows the first embodiment of a page buffer used in a NAND flash memory of the present invention. The page buffer 500 comprises a first latch circuit 510, a second latch circuit 520, a bit line voltage supply circuit 530, a verification circuit 540, an input circuit 550, a pre-charge circuit 560, a bit line selection circuit 570 and a global signal circuit 580. The first latch circuit 510 and the second latch circuit 520 both latch the data programmed into and read from the NAND flash memory connected to the page buffer 500. The bit line voltage supply circuit 530 supplies bit line voltages to the corresponding bit line of the NAND flash memory. The verification circuit 540 verifies the programming operations of the NAND flash memory, including a first verification path formed by transistors T5, T3 and T4, a second verification path formed by transistors T5, T6 and T7, a third verification path formed by transistors T5, T6 and T9, and a fourth verification path formed by transistors T5, T3 and T8. The input circuit 550 receives the data programmed into the NAND flash memory. The pre-charge circuit 560 is operated in response to a signal PLOAD to pre-charge the corresponding bit line, i.e., node SO. The bit line selection circuit 570 selects the corresponding bit line of the programming and reading operations. The global signal circuit 580 outputs verification pass signals to an external circuit. The page buffer 500 further comprises a data-out transistor T25, a data-in transistor T26 and a data-out buffer 590. The data-out transistor T25 transfers the data latched in the first latch circuit 510 to the second latch circuit 520. The data-in transistor T26 transfers the data latched in the second latch circuit 520 to the first latch circuit 510. The data-out buffer 590 outputs the data latched in the second latch circuit 520.

Figure 3:
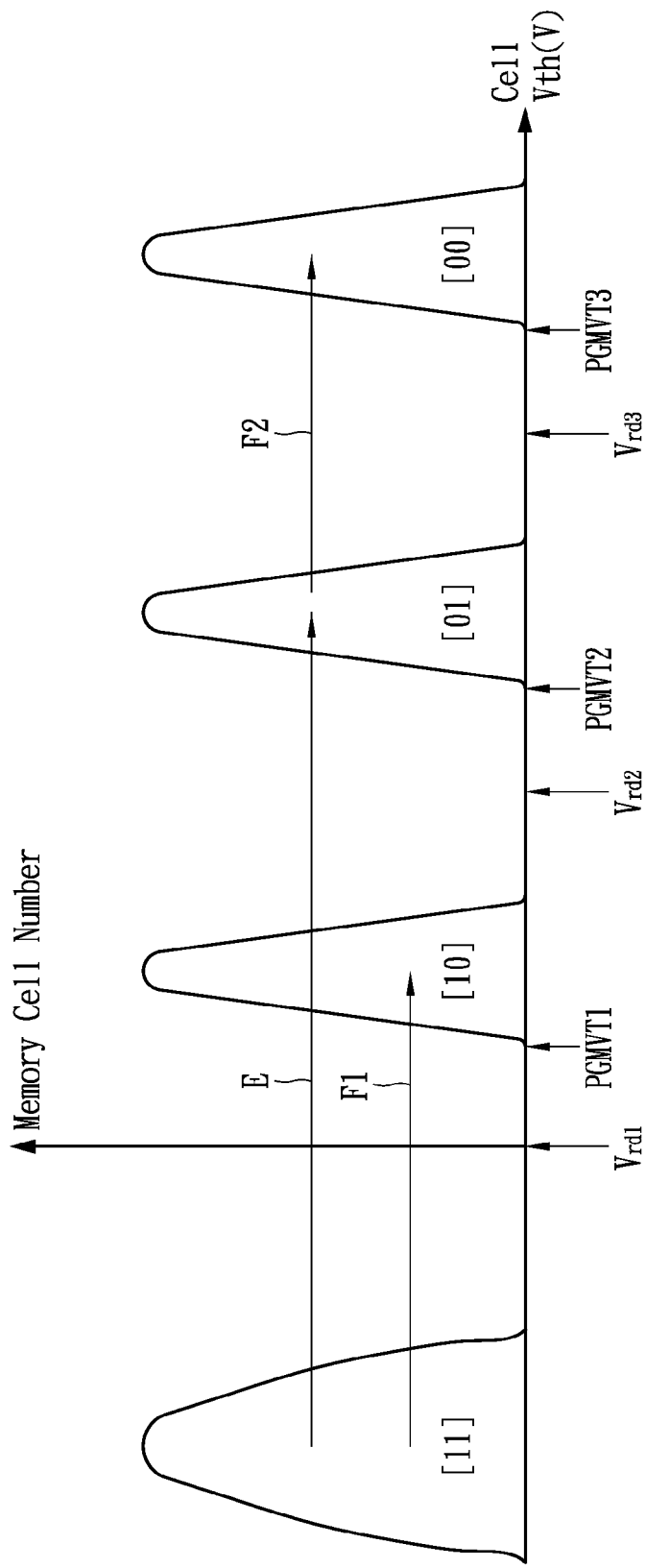
FIG. 3 shows the state transition of the memory cells of the first embodiment of the present invention.

FIG. 3 shows the state transition of the memory cells of the first embodiment of the present invention. As shown in FIG. 3, there are four states, i.e., two bits for the memory cells: [11], [10], [01], [00]. Initially, a memory cell not yet programmed exhibits a standard threshold voltage and is in state [11]. The programming operation includes an MSB programming and two LSB programming. During the MSB programming operation, a memory cell changes its state from [11] to [01], as indicated by the arrow E. During a first LSB programming operation, a memory cell changes its state from [11] to [10], as indicated by the arrow F1. During a second LSB programming operation, a memory cell changes its state from [01] to [00], as indicated by the arrow F2. The program voltages of PGMVT1, PGMVT2, and PGMVT3 applied to the selected word line can be configured as 0.5V, 1.5V, and 2.5V, respectively. The read voltages of $V_{rd1}$, $V_{rd2}$, and $V_{rd3}$ applied to the selected word line can be configured as 0V, 1V, and 2V, respectively.

Referring back to FIG. 2, for the MSB programming operation, the states of nodes A, B, C and D are set to high, low, high and low, respectively. Before data input, the control signals of transistors T15, T1 and T2: S2, PLOAD and RST1 are set to high, low and high, respectively. The signal PLOAD turns on the transistor T1, which pulls node SO to a high state, and therefore turns on a transistor T14. The signal S2 turns on the transistor T15. Accordingly, node B is pulled to a low state, which in turn pulls node A to a high state. On the other hand, the signal RST1 turns on the transistor T2, which pulls node D to a low state, and hence pulls node C to a high state. During data input, the signal ENDI remains in a high state. If the input data is [0], the input signal NDI is set to a high state. Therefore, node A is pulled to a low state. If the input data is [1], the input signal NDI is set to a low state. Then node A remains at high state.

The data-in transistor T26 then transfers the input data latched in the second latch circuit 520 to the first latch circuit 510. Meanwhile, signals S11 and CR are also set to a high state, and hence turn on the transistors T3 and T8. If node A is at a high state, the transistor T5 is also turned on, and node C is pulled to a low state. Otherwise, node C remains at a high state. Accordingly, node C changes to a low state if the input data is [1], or remains at a high state if the input data is [0]. Control signals VBL1 and VBL2 are then set to low and high to turn on transistors T11 and T13, respectively. If node C is at a high state, transistor T12 is turned on, which pulls the voltage at node SO to a ground voltage, and the MSB program operation is allowed. Otherwise, transistor T10 is turned on, which pulls the voltage at node SO to VCC, and the MSB program operation is prohibited.

After the latched data in the second latch circuit 520 is transferred to the first latch circuit 510, the second latch circuit 520 is ready to receive the next input data. Accordingly, the next input data receiving operation and the current data programming operation are executed at the same time. In other words, the operation time required for receiving input data is reduced, and therefore the speed of the MSB programming operation is increased.

Figure 4:
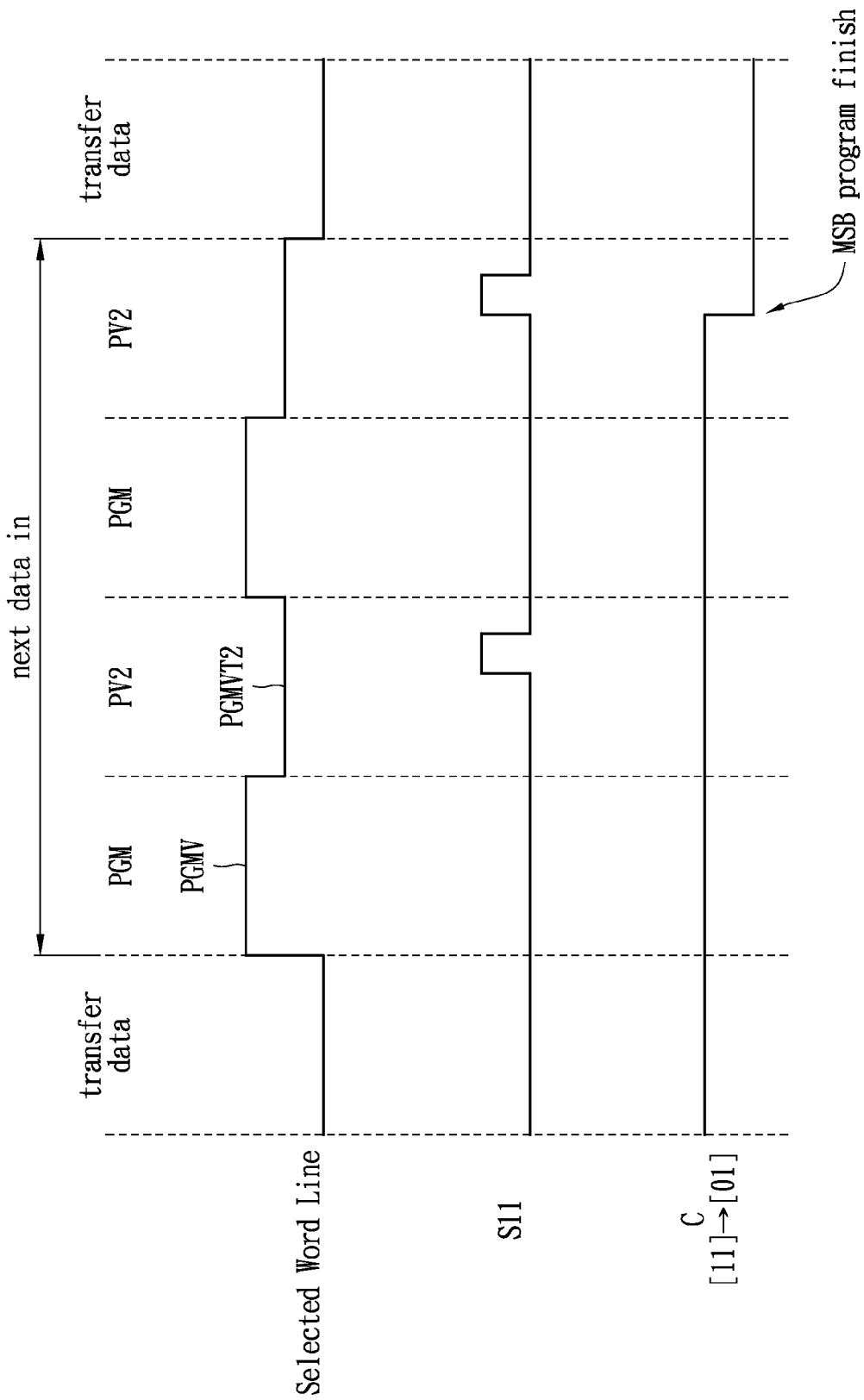
FIG. 4 shows the timing diagram regarding the MSB programming operation of the first embodiment of the present invention.

FIG. 4 shows the timing diagram of the selected word line voltage, the verification signal S11, and the state of the node C during the MSB programming operation, wherein the verification path is the fourth verification path formed by the transistors T5, T3 and T8 of the verification circuit 540. As shown in FIG. 4, during the programming period, the voltage of the selected word line is set to PGMV, which is much higher than PGMVT1 to PGMVT3. The control signal CR is set to a high state, and hence turns on the transistor T8. During the verifying period, the selected word line is set to PGMVT2, and the verification signal S11 outputs a pulse signal. When the MSB programming operation is finished, i.e., the threshold voltage of the accessed memory cell reaches the desired level, the selected word line voltage PGMVT2 can no longer turn on the accessed memory cell, and hence node SO is at a high state. Therefore, the transistor T5 is turned on, and node C is pulled to a low state through the fourth verification path, as shown in FIG. 4.

Referring back to FIG. 2, for the LSB programming operation, nodes A, B, C and D are again set to a high state, a low state, a high state and a low state, respectively, as in the MSB programming operation. The input data is latched into the second latch circuit 520 via the input circuit 550, as described in the MSB programming operation. Afterward, the second latch circuit 520 transfers the input data latched in the second latch circuit 520 to the first latch circuit 510 through the data-in transistor T26. The signal RESET2 is then activated to set node A to a low state and node B to a high state. The selected word line then applies the voltage PGMVT2. If the accessed memory cell is at state [11] or [10], node SO is discharged to a low state. Otherwise, node SO remains at a high state, and hence turns on the transistor T14. Meanwhile, the control signal S2 is activated, and hence turns on the transistor T15. Accordingly, if the MSB stored in the accessed memory cell is [1], node B remains at a high state. Otherwise, node B is pulled to a low state. Control signals VBL1 and VBL2 are then set to low and high to turn on the transistors T11 and T13, respectively, as described in the MSB programming operation. Accordingly, node SO is pulled to a ground voltage if the LSB program operation is allowed, or pulled to VCC if the LSB program operation is prohibited.

The LSB programming operation can be further classified into two operations, a first LSB programming operation and a second LSB programming operation, as indicated by the arrow F1 and F2 in FIG. 3, respectively. As can be seen in FIG. 3, the first LSB programming operation denotes the programming operation for the accessed memory cell to transfer its state from [11] to [10], and the second LSB programming operation denotes the programming operation for the accessed memory cell to transfer its state from [01] to [00]. Because the threshold voltage of the accessed memory cell in state [11] is lower than that of the accessed memory cell in state [01], the operation speed for the first LSB programming operation is faster than that of the second LSB programming operation.

Figure 5:
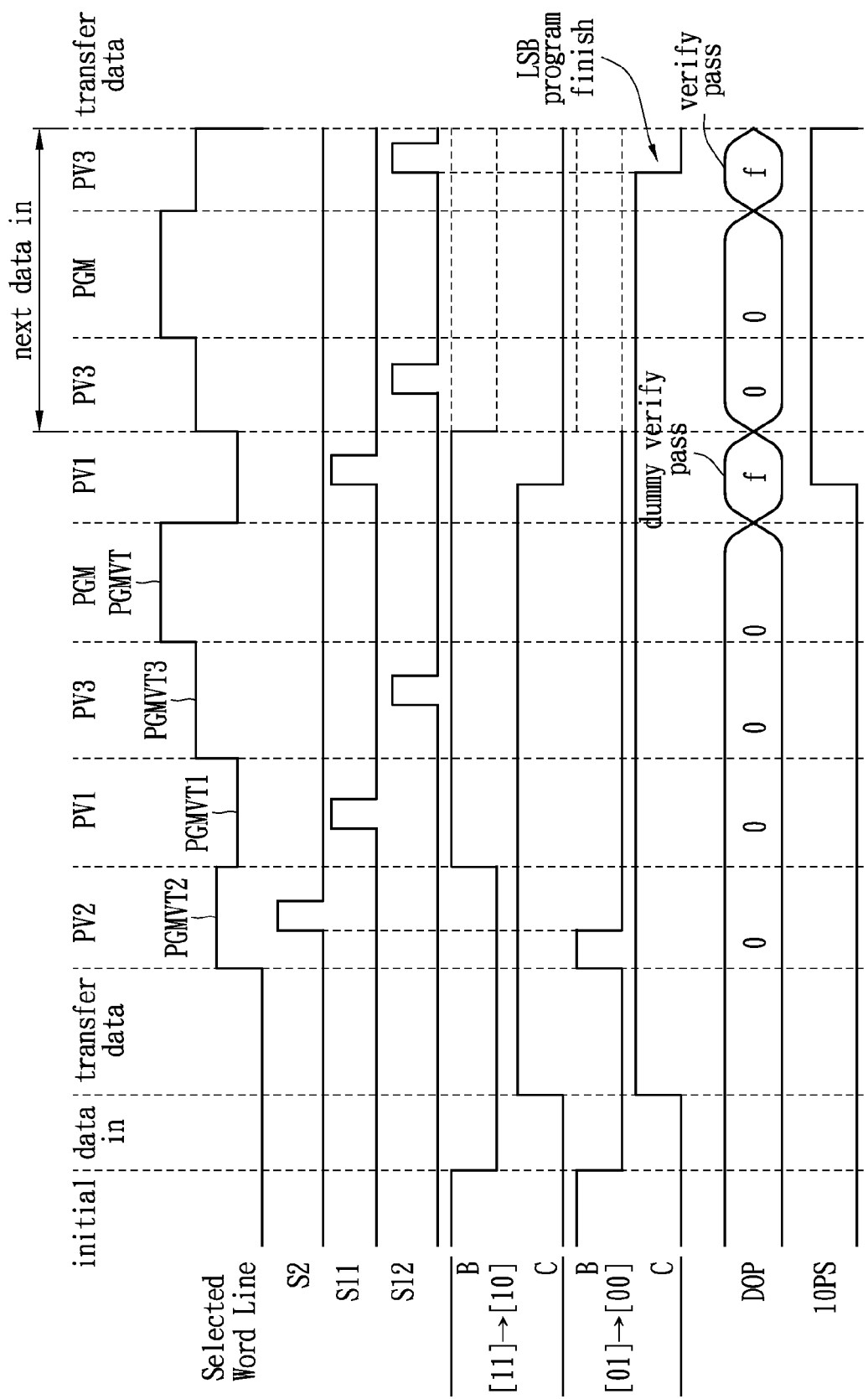
FIG. 5 shows the timing diagram regarding the LSB programming operation of the first embodiment of the present invention.

FIG. 5 shows the timing diagram of the selected word line voltage, the control signal S2, the verification signals S11 and S12, the states of the nodes B and C, an output DOP and an input signal 10PS during the LSB programming operation. Note that there are three verification paths: the first verification path formed by transistors T5, T3 and T4, the second verification path formed by transistors T5, T6 and T7, and the third verification path formed by transistors T5, T6 and T9. As shown in FIG. 5, at first, the input data is latched into the second latch circuit 520. The input data is then transferred to the first latch circuit 510. Then the selected word line is applied a voltage PGMVT2, while the control signal S2 is activated to read the MSB of the accessed memory cell into the second latch circuit 520, as indicated in the PV2 period in FIG. 5. Afterward, the selected word line is applied a voltage PGMVT1, while the verification signal S11 is activated to verify the first LSB programming operation. Then the selected word line is applied a voltage PGMVT3, while the verification signal S12 is activated to verify the second LSB programming operation. Note that the verification operation takes place before the LSB programming operation is executed in case there are accessed memory cells that have been already programmed. Then the selected word line is applied a voltage PGMV for the LSB programming operation, as indicated in the PGM period in FIG. 5. Then the verifying operation for the first LSB programming operation is executed, followed by the verification operation for the second LSB programming operation. The LSB programming operation is then again executed. The operation sequence continues until the programming operations are verified.

The first verification path verifies the first LSB programming operation. Note that if the LSB programming operation of the accessed memory cell is the first LSB programming operation, node B is at a high state. If the threshold voltage of the accessed memory cell reaches the desired level, the selected word line voltage PGMVT1 can no longer turn on the accessed memory cell, and hence node SO is at a high state. Therefore, the transistor T5 is turned on, and node C is pulled to a low state through the first verification path.

The second and the third verification paths verify the second LSB programming operation, while the second verification path is used before the first LSB programming operation is verified, and the third verification path is used after the first LSB programming operation is verified. Note that if the LSB programming operation of the accessed memory cell is the second LSB programming operation, node B is at a low state, and node A is at a high state. If the threshold voltage of the accessed memory cell reaches the desired level, the selected word line voltage PGMVT3 can no longer turn on the accessed memory cell, and hence node SO is at a high state. Therefore, the transistor T5 is turned on, and node C is pulled to a low state through the second verification path.

Referring back to the global signal circuit 580 in FIG. 2, before the first LSB programming operation is verified, transistors T24 and T25 are turned on, hence an output signal DOP is at a low state, as shown in FIG. 5. After the first LSB programming operation is verified, however, node C is at a low state, the transistor T25 is turned off, and hence DOP is floating. As shown in FIG. 5, the floating signal DOP for the verified first LSB programming operation is indicated as a dummy verify pass, which triggers an input signal 10PS indicating that the state transition for the accessed memory cell from [11] to [10] is verified. Note that before the first LSB programming operation is verified, signal DOP would not be affected by the memory cell executing the second LSB programming operation. The floating signal DOP for the verified first LSB programming operation also triggers the next data input operation, as indicated in FIG. 5. Therefore, the second latch circuit 520 latches the input data while the second LSB programming operation is still in progress. Since the second latch circuit 520 is occupied with the input data, the state of node A becomes unknown, and the second verification path for the second LSB programming operation is no longer available. Hence, after the first LSB programming operation is verified, the third verification path is used for the verification operation. Note that the signal 10PS turns on the transistors T9 and T23. If the threshold voltage of the accessed memory cell reaches the desired level, the selected word line voltage PGMVT3 can no longer turn on the accessed memory cell, and hence node SO is at a high state. Therefore, the transistor T5 is turned on, and node C is pulled to a low state through the third verification path.

Referring back again to the global signal circuit 580 in FIG. 2, before the second LSB programming operation is verified, transistors T23 and T25 are turned on; hence the output signal DOP is at a low state. After the second LSB programming operation is verified, node C is at a low state, the transistor T25 is turned off, and DOP is floating again, which is indicated as verify pass as shown in FIG. 5. Thereafter, the data-in transistor T26 is ready to transfer the data latched in the second latch circuit 520 to the first latch circuit 510.

Note that the next input data receiving operation is executed while the second LSB programming operation is still in progress. Therefore, the operation time required for receiving input data is reduced, and the speed of the LSB programming operation is increased.

Referring back to FIG. 2, for the MSB reading operation, the states of nodes A, B, C and D are set to low, high, high and low, respectively, by activating the control signals RST1 and RST2. The signal PLOAD is set to a low state to pre-charge node SO to a high state. Then the selected word line is applied to the read voltage $V_{rd2}$, while the verification signal S11 is activated. If the MSB of the accessed memory cell is [0], the accessed memory cell is turned off. Node SO remains at a high state, which turns on the transistor T5, and hence one of the first and second verification paths pulls node C to a low state. If the MSB of the accessed memory cell is [1], on the other hand, the accessed memory cell is turned on. Node SO is discharged to a low state, and node C remains at a high state. (Note that during the MSB reading operation, node CR is set to a high state, and the verification path for the MSB reading operation is the fourth verification path, which is formed by transistors T5, T3 and T8.) The data-out transistor T25 then transfers the data latched in the first latch circuit 510 to the second latch circuit 520. The data latched in the second latch circuit 520 is then outputted through the data-out buffer 590. During the data output operation, the next output data is read and latched into the first latch circuit 510. Therefore, the operation time required for transmitting output data is reduced, and the speed of the MSB reading operation is increased.

For the LSB reading operation, the states of node A, B, C and D are set to low, high, high and low, respectively, as in the MSB reading operation. Node SO is pre-charged to a high state. The LSB reading operation can be further classified into three operations: a first LSB reading operation, a second LSB reading operation and a third LSB reading operation. The first LSB reading operation differentiates the accessed memory cell of [00] state from the other states. The second LSB reading operation differentiates the accessed memory cell of [00] and [01] state from the other states. The third LSB reading operation differentiates the accessed memory cell of the [10] state from the [11] state.

Figure 6:
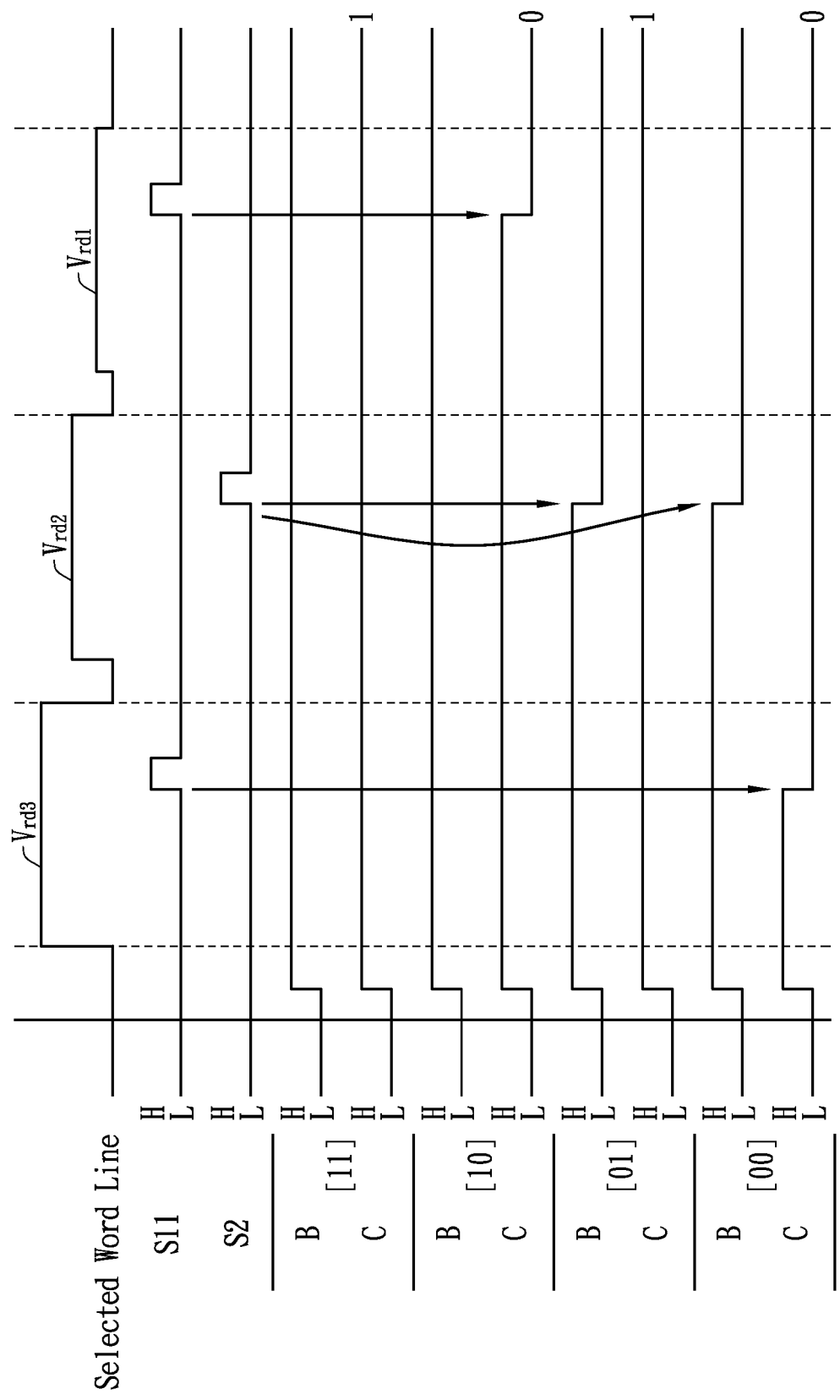
FIG. 6 shows the timing diagram regarding the LSB reading operation of the first embodiment of the present invention.

FIG. 6 shows the timing diagram of the selected word line voltage, the verification signal S11, the control signal S2, and the states of the node B and C during the LSB reading operation. During the first, second and third reading operations, node CR is set to a low state, and the signal IQPS is set to a low state as well. During the first LSB reading operation, the selected word line is applied the read voltage $V_{rd3}$, and the verification signal S11 is activated. If the state of the accessed memory cell is [00], the read voltage $V_{rd3}$ is unable to turn on the accessed memory cell. Therefore node C is pulled to a low state through the first verification path. During the second LSB reading operation, the selected word line is applied the read voltage $V_{rd2}$, and the control signal S2 is activated. If the state of the accessed memory cell is [00] or [01], the read voltage $V_{rd2}$ is unable to turn on the accessed memory cell. Therefore, node B is pulled to a low state by the transistors T14 and T15. During the third LSB reading operation, the selected word line is applied the read voltage $V_{rd1}$, and the verification signal S11 is activated. If the state of the accessed memory cell is [10], the read voltage $V_{rd1}$ is unable to turn on the accessed memory cell. Therefore, node C is pulled to a low state through the first verification path. On the other hand, for the accessed memory cell of state [01], since node B has been pulled to a low state during the second LSB reading operation, the transistor T4 is turned off. Therefore, node C remains at a high state.

Figure 7:
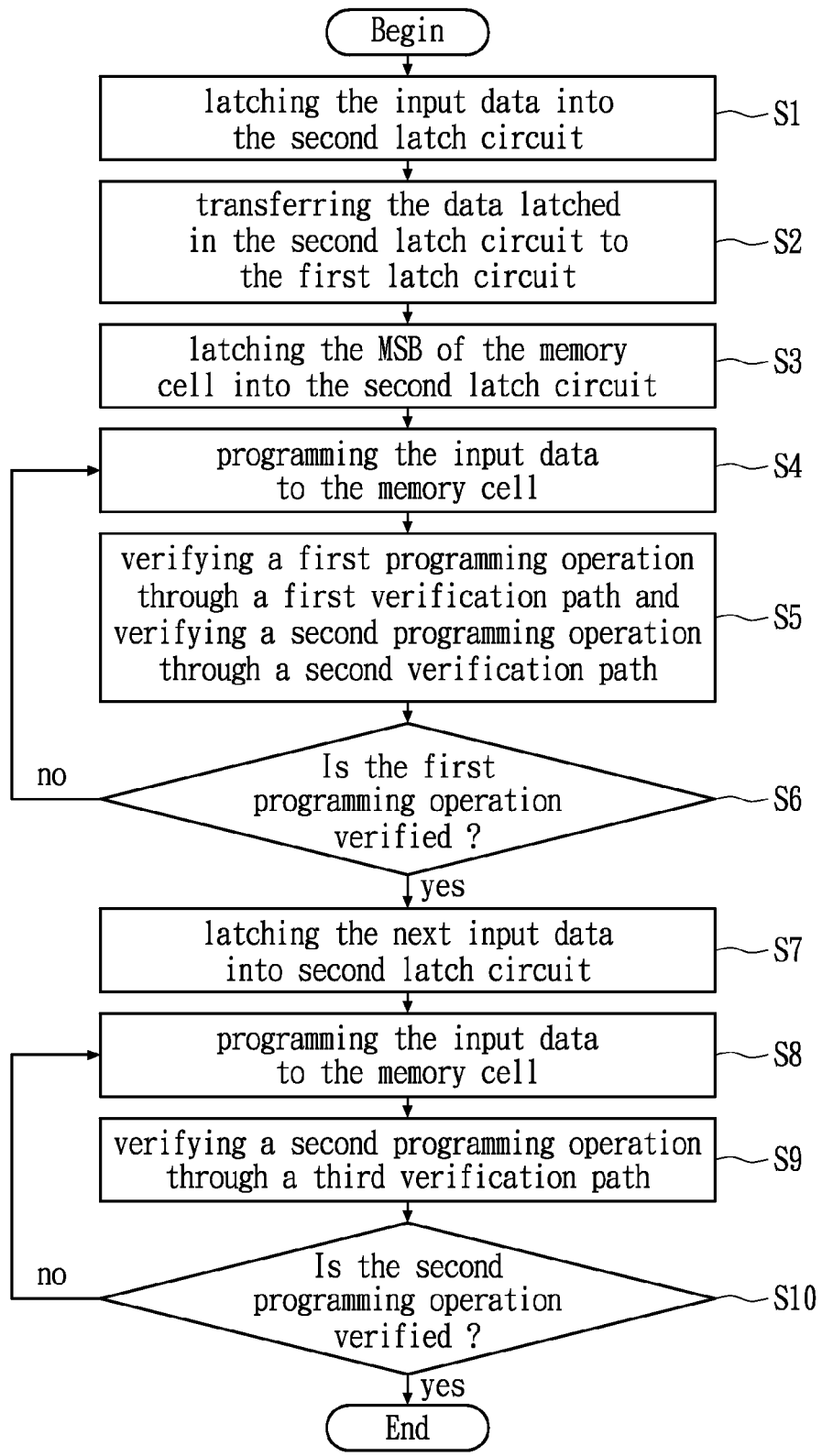
FIG. 7 shows the flow chart of the second embodiment of a method for programming the LSB of a NAND flash memory cell of the present invention.

FIG. 7 shows the flow chart of the second embodiment of a method for programming the LSB of a NAND flash memory cell of the present invention. The NAND flash memory cell is connected to a page buffer. The memory cell comprises two bits: MSB and LSB. The page buffer comprises a first latch circuit and a second latch circuit. In step S1, the input data is latched into the second latch circuit. In step S2, the data latched in the second latch circuit is transferred to the first latch circuit. In step S3, the MSB of the memory cell is latched into the second latch circuit. In step S4, the input data is programmed into the memory cell. In step S5, a first programming operation is verified through a first verification path and a second programming operation is verified through a second verification path. In step S6, whether the first programming operation is verified is checked. If the first programming operation is not verified, the flow returns back to step S4. Otherwise, the flow continues. In step S7, the next input data is latched into the second latch circuit. In step S8, the input data continues to be programmed into the memory cell. In step S9, the second programming operation is verified through a third verification path. In step S10, whether the second programming operation is verified is checked. If the second programming operation is not verified, the flow returns back to step S8.

The above-described embodiments of the present invention are intended to be illustrative only. Numerous alternative embodiments may be devised by those skilled in the art without departing from the scope of the following claims.

What is claimed is:

1. A page buffer used in a NAND flash memory, comprising:
   a first latch circuit for latching the least significant bit (LSB) of programmed data during a first and a second LSB programming operation;
   a second latch circuit for latching the most significant bit (MSB) of the programmed data during the first and the second LSB programming operation;
   a bit line voltage supply circuit for supplying bit line voltages to a corresponding bit line of the NAND flash memory; and
   a verification circuit for verifying programming operations of the NAND flash memory, comprising:
      a first verification path for verifying the first LSB programming operation;
      a second verification path for verifying the second LSB programming operation before the first LSB programming operation is verified; and
      a third verification path for verifying the second LSB programming operation after the first LSB programming operation is verified.

2. The page buffer of claim 1, wherein the verification circuit is electrically connected to the first latch circuit and the second latch circuit.

3. The page buffer of claim 1, wherein the verification circuit further comprises a fourth verification path for verifying a most significant bit (MSB) programming operation.

4. The page buffer of claim 1, wherein after the first LSB programming operation is verified, the next programming data is latched into the second latch circuit.

5. The page buffer of claim 1, wherein during an MSB programming operation, the next programming data is latched into the second latch circuit.

6. The page buffer of claim 1, wherein during an MSB reading operation, the next reading data is latched into the first latch circuit.

7. The page buffer of claim 1, wherein the bit line voltage supply circuit supplies a power voltage and a ground voltage to a corresponding bit line.

8. The page buffer of claim 1, further comprising a global signal circuit for outputting a verification pass signal when the second LSB programming operation is verified.

9. The page buffer of claim 8, wherein the global signal circuit outputs a dummy verification pass signal when the first LSB programming operation is verified.

10. The page buffer of claim 9, wherein the dummy verification pass signal activates the third verification path.

11. The page buffer of claim 1, wherein the second latch circuit controls the first and second verification paths.

12. The page buffer of claim 1, further comprising a data-in transistor for transferring the data latched in the second latch circuit to the first latch circuit.

13. The page buffer of claim 1, further comprising a data-out transistor for transferring the data latched in the first latch circuit to the second latch circuit.

14. The page buffer of claim 1, further comprising an input circuit receiving data to be programmed to the NAND flash memory.

15. The page buffer of claim 1, further comprising a pre-charge circuit for pre-charging a corresponding bit line of the NAND flash memory.

16. The page buffer of claim 1, further comprising a data-out buffer for outputting the data latched in the second latch circuit.

17. A method for programming the LSB of a NAND flash memory cell connected to a page buffer, wherein the memory cell comprises two bits, the page buffer comprises a first latch circuit and a second latch circuit, the method comprising the steps of:

latching the input data into the second latch circuit;

transferring the data latched in the second latch circuit to the first latch circuit;

latching the MSB of the memory cell into the second latch circuit;

programming the input data to the memory cell; and verifying the programming operation while latching the next input data into the second latch circuit.

18. The method of claim 17, wherein the verifying step comprises the steps of:

verifying a first programming operation;

verifying a second programming operation; and latching the next input data into the second latch circuit.

19. The method of claim 18, wherein the first programming operation is verified through a first verification path.

20. The method of claim 19, wherein the step of verifying a second programming operation comprises the steps of:

verifying the second programming operation through a second verification path before the step of verifying a first programming operation is completed; and verifying the second programming operation through a third verification path after the step of verifying a first programming operation is completed.

21. The method of claim 20, wherein the step of verifying the second programming operation through a third verification path after the step of verifying a first programming operation is completed and the step of latching the next input data into the second latch circuit are executed simultaneously.

* * * * *